United States Patent
Kim et al.

(10) Patent No.: US 10,641,988 B2
(45) Date of Patent: May 5, 2020

(54) ANALOG-DIGITAL CONVERTER MODULE AND CAMERA DRIVING APPARATUS INCLUDING THE SAME

(71) Applicant: Samsung Electro-Mechanics Co., Ltd., Suwon-si (KR)

(72) Inventors: Gyu Won Kim, Suwon-si (KR); Kyoung Joong Min, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 153 days.

(21) Appl. No.: 16/007,295

(22) Filed: Jun. 13, 2018

(65) Prior Publication Data
US 2019/0086633 A1    Mar. 21, 2019

(30) Foreign Application Priority Data
Sep. 21, 2017 (KR) .................. 10-2017-0121538

(51) Int. Cl.
*H03M 1/12* (2006.01)
*G02B 7/04* (2006.01)
(Continued)

(52) U.S. Cl.
CPC .............. *G02B 7/102* (2013.01); *G02B 7/09* (2013.01); *G03B 3/10* (2013.01); *G03B 5/00* (2013.01);
(Continued)

(58) Field of Classification Search
CPC ........... H04N 5/23287; H04N 5/23264; H04N 5/2328; H04N 5/2257; H04N 5/23248;
(Continued)

(56) References Cited

U.S. PATENT DOCUMENTS

2009/0086033 A1* 4/2009 Watanabe ............... G03B 5/00
                                                         348/208.2
2009/0160960 A1* 6/2009 Nagata ................ G02B 27/646
                                                         348/208.99
(Continued)

FOREIGN PATENT DOCUMENTS

KR     10-2016-0093257 A     8/2016

OTHER PUBLICATIONS

Geoffrey Brown, "Discovering the STM32 Microcontroller," *STM32 Education—Indiana University*, Jun. 2016, pp. 1-244.
(Continued)

*Primary Examiner* — Kelly L Jerabek
(74) *Attorney, Agent, or Firm* — NSIP Law

(57) ABSTRACT

An analog-digital converter (ADC) module includes: an ADC configured to convert an analog signal into digital data according to a control signal; and an ADC controller configured to receive a mode selection signal setting the ADC controller in one of a plurality of modes, output the control signal to the ADC, and receive the digital data from the ADC. The ADC controller repeatedly outputs the control signal to the ADC using a timer, and stores the digital data in a register in response to an end of conversion (EOC) signal from the ADC, in a first mode. The ADC controller outputs the control signal to the ADC in response to an instruction signal, stores the digital data in the register in response to the EOC signal being input from the ADC, and outputs an interrupt signal to the ADC in response to the digital data being stored in the register, in a second mode.

16 Claims, 4 Drawing Sheets

(51) Int. Cl.
*H04N 5/232* (2006.01)
*G02B 7/10* (2006.01)
*G02B 7/09* (2006.01)
*G03B 3/10* (2006.01)
*G03B 5/00* (2006.01)
*G02B 27/64* (2006.01)
*G02B 7/08* (2006.01)

(52) U.S. Cl.
CPC ..... *H04N 5/23227* (2018.08); *H04N 5/23258* (2013.01); *H04N 5/23287* (2013.01); *G02B 7/08* (2013.01); *G02B 27/646* (2013.01); *G03B 2205/0053* (2013.01); *H03M 1/1245* (2013.01)

(58) Field of Classification Search
CPC ...... H03M 1/12; H03M 1/1245; G02B 7/102; G02B 7/09; G02B 7/10; G02B 7/04; G02B 7/02; G02B 7/023; G02B 27/646
See application file for complete search history.

(56) References Cited

U.S. PATENT DOCUMENTS

| | | | |
|---|---|---|---|
| 2011/0043646 A1* | 2/2011 | Watanabe | G02B 27/646 348/208.4 |
| 2011/0279692 A1* | 11/2011 | Hirayama | G03B 13/36 348/208.2 |
| 2012/0105656 A1* | 5/2012 | Noguchi | H04N 5/23245 348/208.4 |
| 2016/0227090 A1 | 8/2016 | Krey | |
| 2018/0149824 A1* | 5/2018 | Kim | G02B 27/646 |

OTHER PUBLICATIONS

AN013204-0708, "Using Z8 Encore!® DMA-ADC Implementation," *Zilog*—www.zilog.com, 2008, pp. 1-21.

* cited by examiner

ANALOG-DIGITAL CONVERTER MODULE AND CAMERA DRIVING APPARATUS INCLUDING THE SAME

CROSS-REFERENCE TO RELATED APPLICATIONS

This application claims the benefit under 35 U.S.C. § 119(a) of Korean Patent Application No. 10-2017-0121538 filed on Sep. 21, 2017 in the Korean Intellectual Property Office, the entire disclosure of which is incorporated herein by reference for all purposes.

BACKGROUND

1. Field

The following description relates to an analog-digital converter (ADC) module and a camera driving apparatus including the ADC module.

2. Description of Related Art

Generally, a camera module includes a lens barrel in which a lens is disposed, a housing in which the lens barrel is accommodated, and an image sensor that converts an image of a subject into an electrical signal. In accordance with technological advances, a camera driving apparatus including an actuator capable of performing autofocusing adjustment has recently been adopted in such a camera module. Further, such a camera driving apparatus may include an actuator for optical image stabilization (OIS) in order to reduce a resolution degradation phenomenon due to hand-shake.

The camera driving apparatus moves the lens barrel including the lens, detects a position of the lens through a feedback loop, and then adjusts an amount of movement of the lens barrel according to the detected position of the lens. In addition, since a signal that detects the position of the lens is an analog signal, the camera driving apparatus may include an analog-digital converter (ADC) that converts analog signals into digital signals.

Such a camera driving apparatus may be controlled using various control methods, and in a case in which a plurality of lens barrels are adopted, various control methods need to be supported together.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an analog-digital converter (ADC) module includes: an analog-digital converter (ADC) configured to convert an analog signal into digital data according to a control signal; and an ADC controller configured to receive a mode selection signal setting the ADC controller in one of a plurality of modes, output the control signal to the ADC, and receive the digital data from the ADC. In a first mode among the plurality of modes, the ADC controller is configured to repeatedly output the control signal to the ADC using a timer, and store the digital data in a register in response to an end of conversion (EOC) signal being input from the ADC. In a second mode among the plurality of modes, the ADC controller is configured to output the control signal to the ADC in response to an instruction signal from an external source, store the digital data in the register in response to the EOC signal being input from the ADC, and output an interrupt signal to the ADC in response to the digital data being stored in the register.

The ADC controller may be further configured to output a start signal to the ADC and repeatedly output the control signal to the ADC using the timer based on the start signal, in the first mode.

The ADC controller may be further configured to output a start signal to the ADC in response to an instruction signal which is input from the external source and then output the control signal to the ADC, in the second mode.

The ADC controller may be further configured to set a channel of the ADC and output a channel selection signal to the ADC according to the set channel, in response to the mode selection signal setting the ADC controller in the first mode.

The ADC controller may be further configured to receive a channel selection signal together with an instruction signal from the external source and output the channel selection signal to the ADC to set a channel of the ADC, in response to the mode selection signal setting the ADC controller in the second mode.

The ADC controller may be configured to repeatedly output the control signal to the ADC using the timer, store the digital data in the register in response to the EOC signal being input from the ADC, and output the interrupt signal to the ADC, in a third mode among the plurality of modes.

The ADC controller may be further configured to repeatedly output a start signal to the ADC using the timer, in the third mode.

The ADC controller may be further configured to repeatedly output the control signal to the ADC at each of sampling periods, in the first mode.

The ADC controller may be further configured to receive the digital data from the ADC, perform an average value filtering for the digital data, and store the average value filtered digital data in the register.

The ADC may be further configured to operate in a sample and hold mode.

The ADC controller may include a mode controller configured to receive the mode selection signal and set a signal input and output timing of the ADC controller according to the selected mode, a register configured to store the digital data, an output controller configured to output the interrupt signal to the ADC after the digital data is stored in the register, and a control signal generator configured to generate the control signal.

In another general aspect, a camera driving apparatus includes: a camera controller configured to receive position data indicating a position of a lens and output a driving control signal to drive the lens; an actuator configured to move the lens according to the driving control signal; and an analog-digital converter (ADC) module configured to receive an analog signal that senses the position of the lens and convert the analog signal into digital position data. The ADC module includes an ADC configured to convert the analog signal into the digital position data according to a control signal, and an ADC controller configured to receive a mode selection signal, output the control signal to the ADC, and receive the digital position data from the ADC. The ADC controller is configured to repeatedly output the control signal to the ADC using a timer, and store the digital position data in a register in response to an end of conversion (EOC) signal being input from the ADC, in a first mode set by the mode selection signal. The ADC controller is configured to output the control signal to the ADC in response to an instruction signal from the camera controller, store the digital position data in the register in response to the EOC signal being input from the ADC, and output an interrupt signal to the ADC in response to the digital position data being stored in the register, in a second mode set by the mode selection signal.

The ADC controller is further configured to repeatedly output the control signal to the ADC using the timer, store the digital position data in the register in response to the EOC signal being input from the ADC, and output the interrupt signal to the ADC in response to the digital position data being stored in the register, in a third mode set by the mode selection signal.

The ADC controller may be further configured to output a start signal to the ADC and repeatedly output the control signal to the ADC using the timer based on the start signal, in the first mode.

The ADC controller may be further configured to set a channel of the ADC and output a channel selection signal to the ADC according to the set channel, in response to the mode selection signal setting the first mode.

The ADC controller may be further configured to receive a channel selection signal together with an instruction signal from the camera controller and output the channel selection signal to the ADC to set a channel of the ADC, in response to the mode selection signal setting the second mode.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
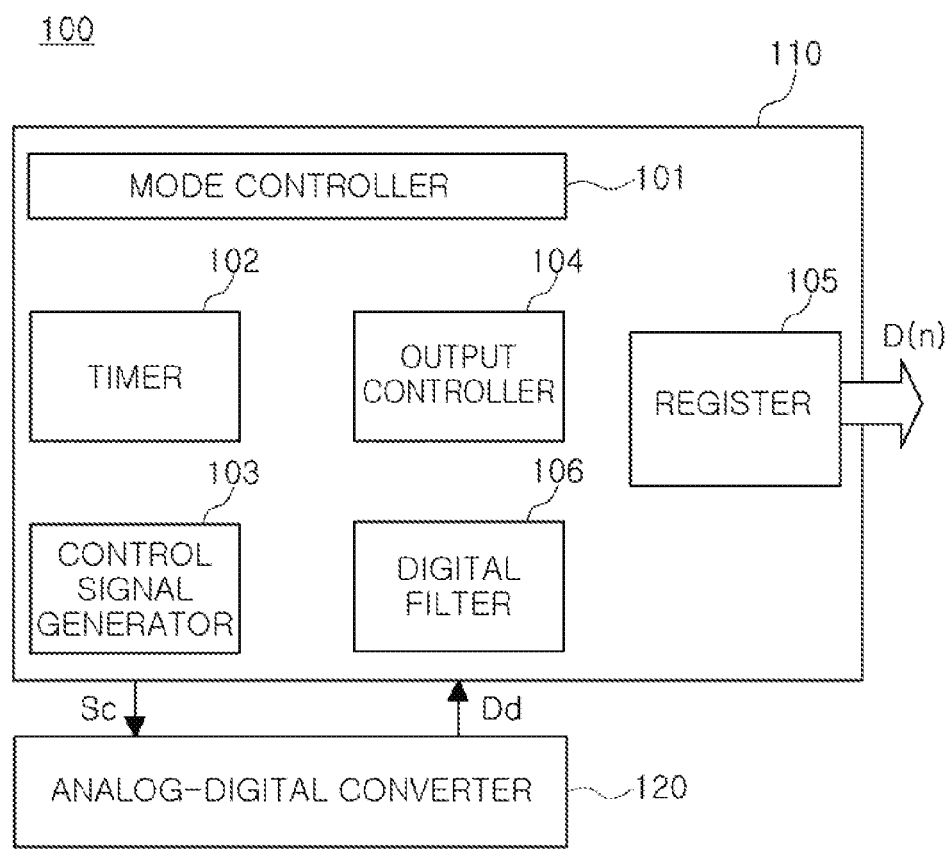
FIG. 1 is a block diagram illustrating an analog-digital converter (ADC) module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a block diagram illustrating an analog-digital converter (ADC) module 100, according to an embodiment.

Referring to FIG. 1, an ADC module 100 includes an ADC controller 110 and an analog-digital converter (ADC) 120.

The analog-digital converter 120 may receive a control signal and may convert an analog signal into digital data Dd according to the control signal. In addition, the ADC 120 may provide the digital data Dd to the ADC controller 110.

As an example, the ADC 120 may operate in a sample & hold mode, and the control signal may include a sample signal and a hold signal. In addition, the ADC 120 may receive a start signal that indicates a start of the conversion.

The ADC controller 110 may output the control signal to the analog-digital converter 120 and may receive the digital data Dd from the ADC 120. In addition the digital data Dd may be stored in a register 105 of the ADC controller 110.

In addition, the ADC controller 110 may receive a mode selection signal and may operate in various modes according to the mode selection signal.

In a first mode, the ADC controller 110 may repeatedly output a control signal Sc to the ADC 120 every predetermined or specified period using a timer 102. Thereafter, when the ADC controller 110 receives an end of conversion (EOC) signal from the ADC 120, the ADC controller 110 may capture the digital data Dd provided from the ADC 120 and may store the digital data Dd in the register 105.

In addition, in the first mode, the ADC controller 110 may output one start signal to the ADC 120 and may repeatedly output the control signal Sc every predetermined or specified period based on the start signal. In addition, the ADC controller 110 may set a channel of the ADC 120 when the mode is set, and may output the channel selection signal to the ADC 120 according to the set channel.

In a second mode, the ADC controller 110 may output the control signal Sc to the ADC 120 in response to an instruction signal from an external source. Unlike the first mode in which the control signal Sc is repeatedly output using the timer, the control signal Sc in the second mode may be output when the instruction signal is input. Thereafter, when the ADC controller 110 receives an EOC signal from the ADC 120, the ADC controller 110 may capture the digital data Dd provided from the ADC 120 and may store the digital data Dd in the register 105. Next, the ADC controller 110 may output an interrupt signal to the ADC to notify the ADC that the digital data Dd requested by the instruction signal is stored in the register 105.

In addition, in the second mode, the ADC controller 110 may output the start signal to the ADC 120 in response to the instruction signal which is input from the external source and may then output the control signal Sc. In addition, the ADC controller 110 may receive a channel selection signal that sets a channel of the ADC 120 together with the instruction signal from the external source, and may output the channel selection signal to the ADC 120.

In addition, according to an embodiment, the ADC controller 110 may operate in a third mode.

In the third mode, the ADC controller 110 may repeatedly output a control signal Sc to the ADC 120 every predetermined or specified period using a timer 102. Thereafter, when the ADC controller 110 receives an EOC signal from the ADC 120, the ADC controller 110 may capture the digital data Dd provided from the ADC 120 and may store the digital data Dd in the register 105. Similarly to the second mode, the ADC controller 110 may output an interrupt signal to notify that the digital data Dd requested by the instruction signal is stored in the register 105.

In addition, in the third mode, the ADC controller 110 may repeatedly output a start signal and the control signal Sc to the ADC 120 using the timer 102.

Specifically, the ADC controller 110 may include a mode controller 101, a timer 102, a control signal generator 103, an output controller 104, a register 105, and a digital filter 106.

The mode controller 101 may receive a mode selection signal and may set an input and output timing of the signal according to a mode selected by the mode selection signal. That is, the mode controller 101 may set whether or not the start signal, the control signal, and the interrupt signal are output and the timings thereof according to the selected mode, and may control the timer 101, the control signal generator 103, and the output controller 104.

The timer 102 may operate according to a control of the mode controller 101, and may provide timing information to the control signal generator 103 and the output controller 104 every predetermined or specified period.

The control signal generator 103 may output the control signal Sc and the output controller 104 may output the interrupt signal.

The register 105, which is a memory region for storing the digital data Dd, may sequentially store the digital data Dd provided from the ADC 120 in N+1 memory regions.

The digital filter 106 may digitally filter the digital data Dd provided from the ADC 120. That is, the ADC controller 110 may receive the digital data Dd from the ADC 120, digital-filter the digital data Dd, and then store the digital data Dd in the register 105. The digital-filtering may be performed by an average value filtering method. The average value filtering method will be described in more detail with reference to FIG. 5.

As described above, the ADC module 100 may operate in various modes, and various modes may be operated in various control methods of driving a camera. Hereinafter, a camera driving apparatus including the ADC module 100, according to an embodiment, will be described.

Figure 2:
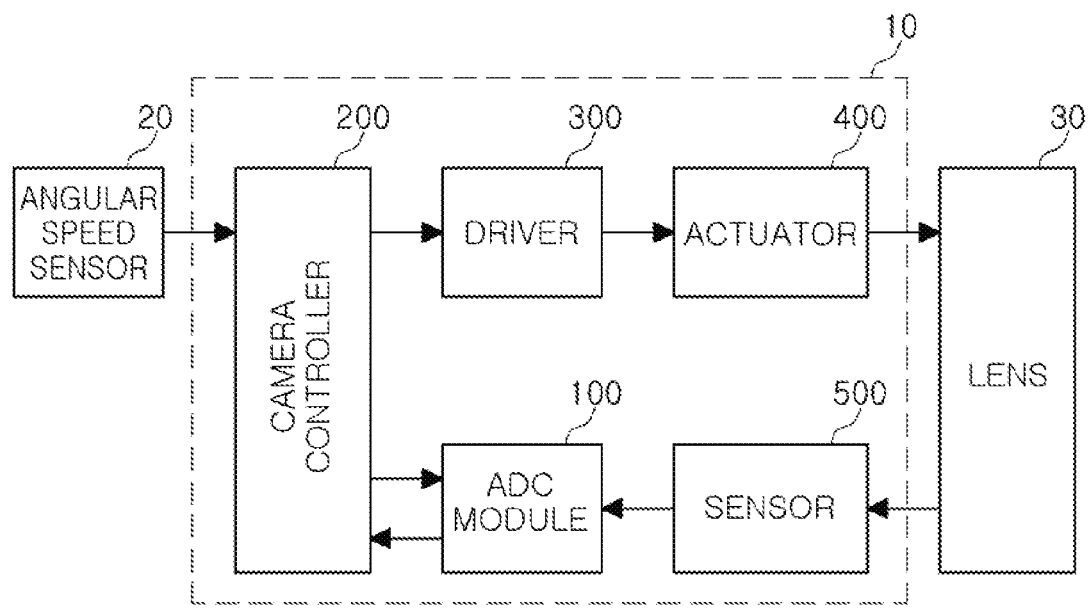
FIG. 2 is a block diagram illustrating a camera driving apparatus including an ADC module, according to an embodiment.

FIG. 2 is a block diagram illustrating a camera driving apparatus 10, which includes the ADC module, according to an embodiment 100.

The camera driving apparatus 10 includes an ADC module 100, a camera controller 200, a driver 300, and an actuator 400. In addition, the camera driving apparatus 10 may further include a sensor 500 that senses a position of a lens (or a lens barrel including the lens) and outputs an analog signal.

The ADC module 100 may receive the analog signal that senses the position of the lens and may convert the analog signal into digital data. In addition, the digital data may be provided to the camera controller 200 as position data. As described with reference to FIG. 1, the ADC module 100 may operate in various modes by control of the ADC controller 110. In addition, the ADC module 100 may be implemented as a portion of the camera controller 200.

The camera controller 200 may output a driving control signal according to an angular speed signal and the position data which are input from the external source. In addition, the camera controller 200 may output a control signal to the ADC module 100 and may receive the position data in response to the control signal output to the ADC module 100. The camera controller 200 may be implemented in a combination of hardware such as a microprocessor or the like and software mounted on hardware and programmed to perform a predefined operation. The hardware may include at least one processor and a memory. The processor may include, for example, a central processing unit (CPU), a microprocessor, an application specific integrated circuit (ASIC), field programmable gate arrays (FPGA), or other processing devices, and may have a plurality of cores. The memory may be a volatile memory (e.g., a random access memory (RAM)), a non-volatile memory (e.g., a read only memory (ROM) or a flash memory), or a combination thereof.

In addition, the camera controller 200 may be implemented as a portion of an application integrated circuit (IC) mounted in an electronic device including the camera module.

The angular speed sensor 20, which is a sensor for detecting a shake of a mobile device, a camera, or another device for capturing images, may be a two-axis, three-axis or greater-than-three-axis gyro sensor, and may detect angular speed of a motion.

The driver 300 may receive the driving control signal and may output a driving signal for driving the actuator 400.

Meanwhile, the actuator 400 may receive the driving signal and may adjust a position of a lens barrel supporting the lens 30 or a lens group according to the driving signal. The actuator 400 may be implemented by a voice coil motor (VCM) mode using electromagnetic force between a coil and a magnet, an ultrasonic motor mode using a piezoelectric element, and a mode of applying a current to a wire of a shape memory alloy to drive the actuator 400.

Depending on the mode of the actuator 400, the driver 300 may output a linear current signal or output a pulse width modulation (PWM) signal.

In addition, the sensor 500 may sense a position of a lens (or a lens barrel) moved by the driver 300 and may output the analog signal as feedback information. However, according to a control mode of the camera driving apparatus 10, the signal which is output from the actuator 400 may be directly input to the ADC module 100. Therefore, the sensor 500 may be omitted and the signal which is output from the actuator 400 may replace the feedback information indicating the position of the lens.

As described with reference to FIG. 1, the ADC module 100 may operate in the first to third modes.

For example, the ADC module 100, when operating in the first mode, may be advantageous in terms of power consumption. Specifically, in the first mode, when the ADC module 100 receives an instruction signal from the camera controller 200, the ADC module 100 may repeatedly convert the analog signal into the digital data every sampling period by the ADC controller 110 outputting one start signal. That is, since the ADC module 100 does not receive a repetitive instruction signal from the camera controller 200 in the first mode, the power consumption of the camera controller 200 may be reduced.

In addition, in a mode in which the driver 300 outputs the PWM signal, the camera controller 200 needs to receive digital data of a specific channel of the ADC 120 in a specific section of the PWM signal. The ADC module 100, when operating in the second mode, may receive the instruction signal in a specific section of the PWM signal from the camera controller 200, and may provide digital data of the specific channel of the ADC 120 according to the instruction signal. That is, in the second mode, the camera controller 200 and the ADC module 100 may be stably synchronized with each other to rapidly provide the digital data.

As described above, the ADC module 100 may operate in various modes according to the control mode of the actuator 400 of the camera driving apparatus 10, the power consumption, and whether or not the input signal and the output signal of the sensor 500 are synchronized with each other.

Figure 3:
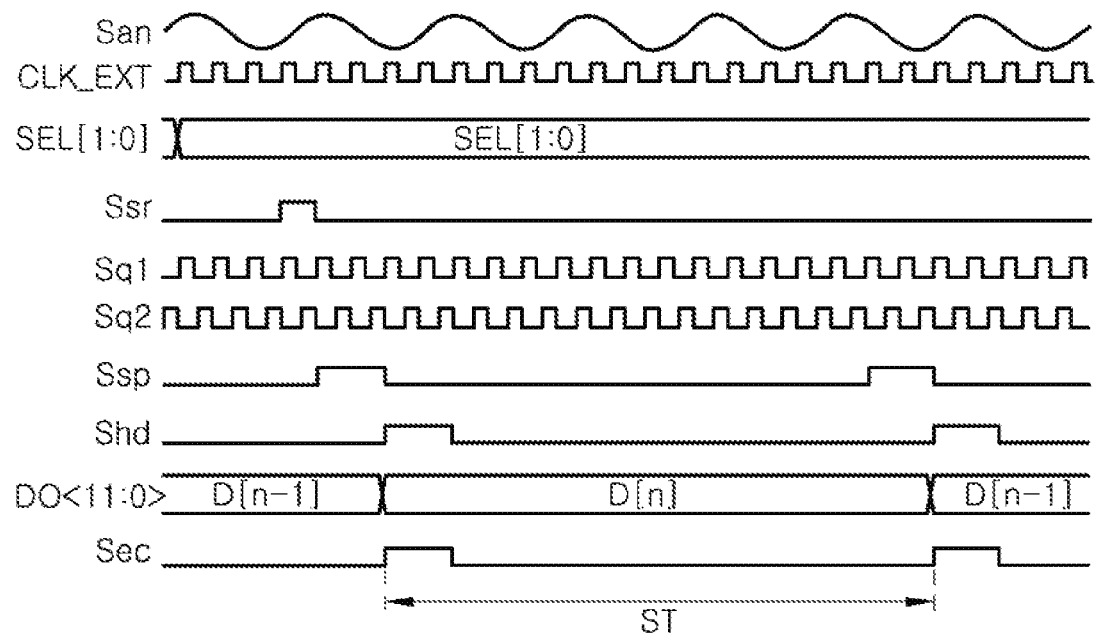
FIG. 3 is an example of a timing diagram of the ADC module operating in a first mode.
Figure 4:
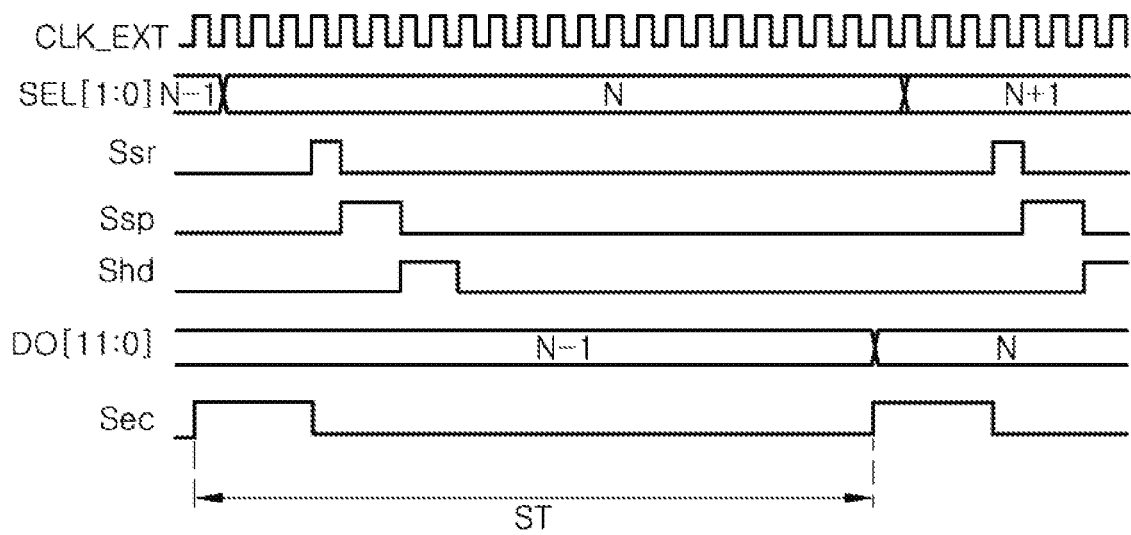
FIG. 4 is an example of a timing diagram of the ADC module operating in a second mode.

FIG. 3 is an example of a timing diagram of the ADC module 100 operating in a first mode. FIG. 4 is an example of a timing diagram of the ADC module 100 operating in a second mode.

Referring to FIGS. 3 and 4, it can be observed that the ADC module 100 converts an analog signal San into a digital signal (DO<11:0>).

Referring to FIG. 3, in the first mode, the ADC controller 110 (FIG. 1) may output one start signal Ssr. Next, the ADC controller 110 may repeatedly output a sample signal Ssp and a hold signal Shd as a control signal every sampling period ST. In addition, before outputting the start signal Ssr, the ADC controller 110 may set a channel of the ADC 120 (FIG. 1) and may output channel selection signals Sq1 and Sq2 which are alternately repeated.

Referring to FIG. 4, in the second mode, the ADC controller 110 may output the start signal Ssr in response to the instruction signal from the external source. Next, the ADC controller 110 may output the sample signal Ssp and the hold signal Shd as the control signal. In addition, the ADC controller 110 may receive a signal (SEL[1:0]) for setting the channel of the ADC 120 together with the instruction signal.

Figure 5:
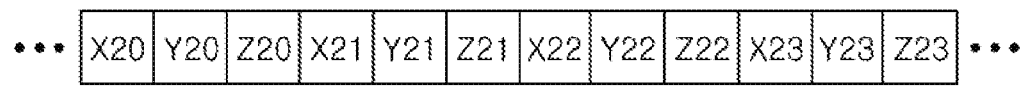
FIG. 5 is a diagram illustrating a method for filtering an average value, according to an embodiment.

FIG. 5 is a diagram illustrating a method for filtering an average value, according to an embodiment.

Referring to FIG. 5, the digital data captured from the ADC 120 (FIG. 1) may be confirmed. X20 to X23 are digital data in which sampling values of a first channel of the ADC 120 are listed, and Y20 to Y23 are the digital data of a second channel, and Z20 to Z23 are the digital data of a third channel.

For example, in the average value filtering mode, X21 is added to X20 or X22, and an average value obtained by dividing the sum by 2 is again then given to a position of X21. In addition, X22 is added to X21 or X23, and an average value obtained by dividing the sum by 2 is given to a position of X22. As described above, one sampling value may be averaged with a previous or later sampling value, and the number of averaged sampling values may be changed. The ADC module 100 may correct instantaneous noise included in the digital data by such an average value filtering, and may ensure reliability of data.

Figure 6:
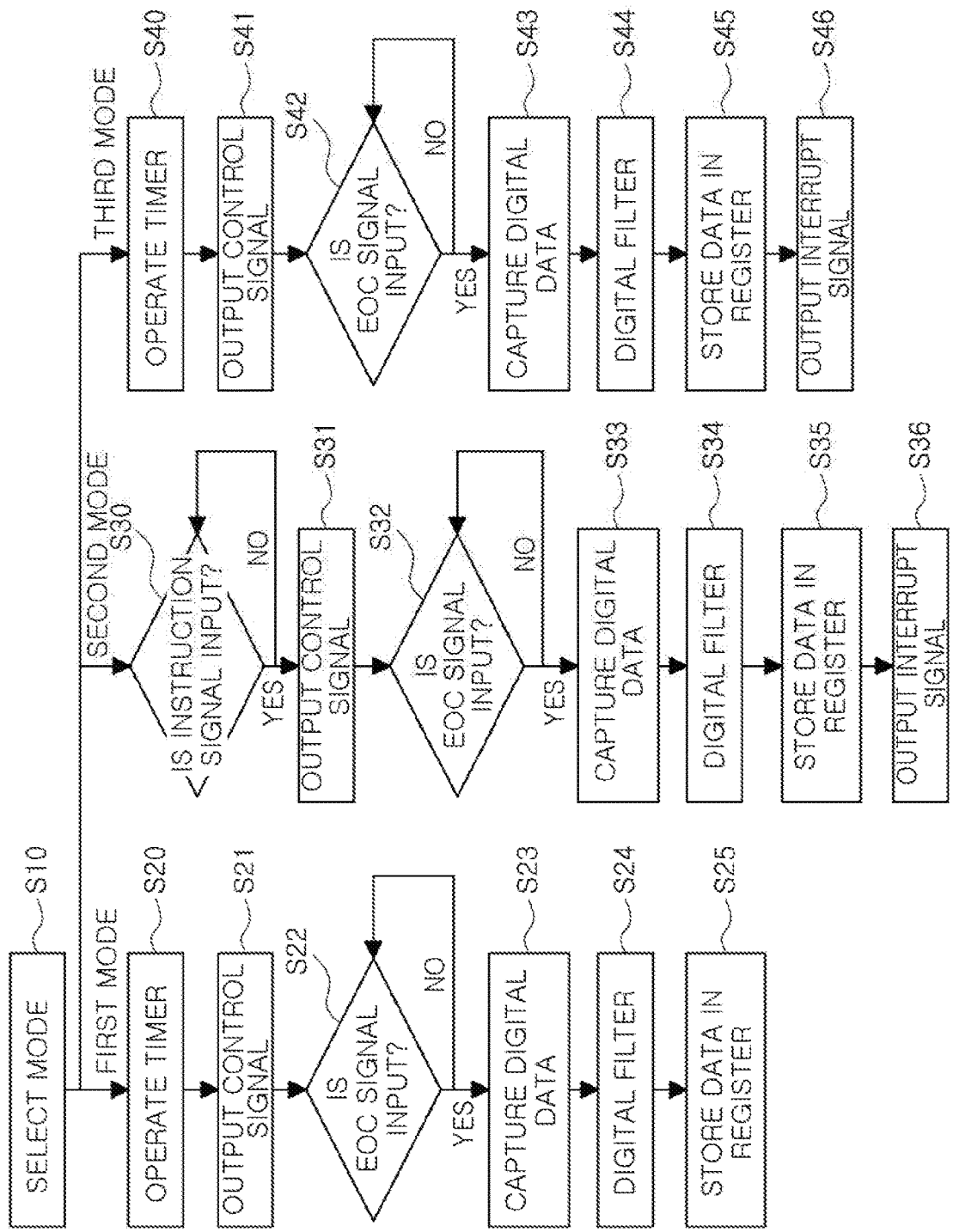
FIG. 6 is a flowchart illustrating an operation of the ADC module, according to an embodiment.

FIG. 6 is a flowchart illustrating an operation of the ADC module 100 (FIG. 1), according to an embodiment.

First, in operation S10, the ADC module 100 may receive a mode selection signal for setting a mode. Next, the ADC module 100 may operate in any one of a first mode to a third mode according to the set mode.

In the first mode, the ADC controller 110 may operate the timer 102 (FIG. 1) in operation S20 and may output the control signal using the timer 102 in operation S21. Next, the analog-digital converter 120 (FIG. 1) may convert an analog signal into digital data and may output an EOC signal. If the EOC signal is input from the analog-digital converter in operation S22, the ADC controller may capture the digital data in operation S23. The captured digital data may be digitally filtered in operation S24, and the filtered digital data may be stored in the register in operation S25. In addition, the ADC module 100 may return to operation S21 to repeatedly perform the above-mentioned operations.

In the second mode, the ADC controller 110 (FIG. 1) may wait for an input of the instruction signal from the external source in operation S30. If the instruction signal is input, the ADC controller 110 may output the control signal in operation S31. Next, the ADC 120 may convert the analog signal to the digital data and may output the EOC signal. If the EOC signal is input from the ADC 120 in operation S32, the ADC controller 110 may capture the digital data in operation S33. The captured digital data may be digitally filtered in operation S34, and the filtered digital data may be stored in the register in operation S35. After storing the filtered digital data in the register, the ADC controller 110 may output an interrupt signal in operation S36. In addition, the ADC module 100 may return to operation S30 to again wait for the input of the instruction signal.

In the third mode, the ADC controller 110 may operate the timer in operation S40, and may output the control signal using the timer in operation S41. Next, the ADC 120 may convert the analog signal to the digital data and may output the EOC signal. If the EOC signal is input from the ADC in operation S42, the ADC controller 110 may capture the digital data in operation S43. The captured digital data may be digitally filtered in operation S44, and the filtered digital data may be stored in the register in operation S45. After storing the filtered digital data in the register, the ADC controller 110 may output an interrupt signal in operation S46. In addition, the ADC module may return to operation S41 to repeatedly perform the above-mentioned operations.

As set forth above, according to the embodiments disclosed herein, an ADC module and a camera driving apparatus including the ADC module may operate in various modes depending on the control method of the actuator, the power consumption, and whether or not the input signal and the output signal of the sensor 500 are synchronized with each other.

The ADC module 100 in FIGS. 1 and 2, the ADC controller 110, the mode controller 101, the timer 102, the control signal generator 103, the output controller 104, the register 105, the digital filter 106, and the ADC 120 in FIG. 1, and the camera controller 200 and the driver 300 in FIG. 2 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIG. 6 that performs the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An analog-digital converter (ADC) module, comprising:
    an analog-digital converter (ADC) configured to convert an analog signal into digital data according to a control signal; and
    an ADC controller configured to receive a mode selection signal setting the ADC controller in one of a plurality of modes, output the control signal to the ADC, and receive the digital data from the ADC,
    wherein, in a first mode among the plurality of modes, the ADC controller is configured to repeatedly output the control signal to the ADC using a timer, and store the digital data in a register in response to an end of conversion (EOC) signal being input from the ADC, and
    wherein, in a second mode among the plurality of modes, the ADC controller is configured to output the control signal to the ADC in response to an instruction signal from an external source, store the digital data in the register in response to the EOC signal being input from the ADC, and output an interrupt signal to the ADC in response to the digital data being stored in the register.

2. The ADC module of claim 1, wherein the ADC controller is further configured to output a start signal to the ADC and repeatedly output the control signal to the ADC using the timer based on the start signal, in the first mode.

3. The ADC module of claim 1, wherein the ADC controller is further configured to output a start signal to the ADC in response to an instruction signal which is input from the external source and then output the control signal to the ADC, in the second mode.

4. The ADC module of claim 1, wherein the ADC controller is further configured to set a channel of the ADC and output a channel selection signal to the ADC according to the set channel, in response to the mode selection signal setting the ADC controller in the first mode.

5. The ADC module of claim 1, wherein the ADC controller is further configured to receive a channel selection signal together with an instruction signal from the external source and output the channel selection signal to the ADC to set a channel of the ADC, in response to the mode selection signal setting the ADC controller in the second mode.

6. The ADC module of claim 1, wherein the ADC controller is configured to repeatedly output the control signal to the ADC using the timer, store the digital data in the register in response to the EOC signal being input from the ADC, and output the interrupt signal to the ADC, in a third mode among the plurality of modes.

7. The ADC module of claim 6, wherein the ADC controller is further configured to repeatedly output a start signal to the ADC using the timer, in the third mode.

8. The ADC module of claim 1, wherein the ADC controller is further configured to repeatedly output the control signal to the ADC at each of sampling periods, in the first mode.

9. The ADC module of claim 1, wherein the ADC controller is further configured to receive the digital data from the ADC, perform an average value filtering for the digital data, and store the average value filtered digital data in the register.

10. The ADC module of claim 1, wherein the ADC is further configured to operate in a sample and hold mode.

11. The ADC module of claim 1, wherein the ADC controller comprises
    a mode controller configured to receive the mode selection signal and set a signal input and output timing of the ADC controller according to the selected mode,
    a register configured to store the digital data,
    an output controller configured to output the interrupt signal after the digital data is stored in the register, and
    a control signal generator configured to generate the control signal.

12. A camera driving apparatus comprising:
    a camera controller configured to receive position data indicating a position of a lens and output a driving control signal to drive the lens;
    an actuator configured to move the lens according to the driving control signal; and
    an analog-digital converter (ADC) module configured to receive an analog signal that senses the position of the lens and convert the analog signal into digital position data, wherein the ADC module comprises
- an ADC configured to convert the analog signal into the digital position data according to a control signal, and
- an ADC controller configured to receive a mode selection signal, output the control signal to the ADC, and receive the digital position data from the ADC, wherein the ADC controller is configured to repeatedly output the control signal to the ADC using a timer, and store the digital position data in a register in response to an end of conversion (EOC) signal being input from the ADC, in a first mode set by the mode selection signal, and wherein the ADC controller is configured to output the control signal to the ADC in response to an instruction signal from the camera controller, store the digital position data in the register in response to the EOC signal being input from the ADC, and output an interrupt signal to the ADC in response to the digital position data being stored in the register, in a second mode set by the mode selection signal.

13. The camera driving apparatus of claim 12, wherein the ADC controller is further configured to repeatedly output the control signal to the ADC using the timer, store the digital position data in the register in response to the EOC signal being input from the ADC, and output the interrupt signal to the ADC in response to the digital position data being stored in the register, in a third mode set by the mode selection signal.

14. The camera driving apparatus of claim 12, wherein the ADC controller is further configured to output a start signal to the ADC and repeatedly output the control signal to the ADC using the timer based on the start signal, in the first mode.

15. The camera driving apparatus of claim 12, wherein the ADC controller is further configured to set a channel of the ADC and output a channel selection signal to the ADC according to the set channel, in response to the mode selection signal setting the first mode.

16. The ADC module of claim 12, wherein the ADC controller is further configured to receive a channel selection signal together with an instruction signal from the camera controller and output the channel selection signal to the ADC to set a channel of the ADC, in response to the mode selection signal setting the second mode.

* * * * *